US012677631B2

(12) United States Patent
Song

(10) Patent No.: US 12,677,631 B2
(45) Date of Patent: Jul. 7, 2026

(54) CEILING STOCKER

(71) Applicant: SEMES CO., LTD., Cheonan-si (KR)

(72) Inventor: Jin-Ho Song, Cheonan-si (KR)

(73) Assignee: Semes Co., LTD., Cheonan-si (KR)

( * ) Notice: Subject to any disclaimer, the term of this patent is extended or adjusted under 35 U.S.C. 154(b) by 184 days.

(21) Appl. No.: 18/322,986

(22) Filed: May 24, 2023

(65) Prior Publication Data

US 2024/0194510 A1 Jun. 13, 2024

(30) Foreign Application Priority Data

Dec. 7, 2022 (KR) ........................ 10-2022-0169473

(51) Int. Cl.
H10P 72/30 (2026.01)
B65G 1/04 (2006.01)
B66C 17/00 (2006.01)

(52) U.S. Cl.
CPC ............ H10P 72/3221 (2026.01); B65G 1/04 (2013.01); B66C 17/00 (2013.01); H10P 72/3214 (2026.01); H10P 72/3218 (2026.01)

(58) Field of Classification Search
CPC ........ B66C 17/00; B65G 1/04; B65G 1/0457; B65G 1/0464; H01L 21/67736; H01L 21/67769; H01L 21/67724; H01L 21/67733; H01L 21/6773; H10P 72/3214; H10P 72/3404; H10P 72/3222; H10P 72/3221; H10P 72/3218
USPC ...................................................... 198/345.3
See application file for complete search history.

(56) References Cited

U.S. PATENT DOCUMENTS

| | | | | |
|---|---|---|---|---|
| 6,183,184 B1 * | 2/2001 | Shiwaku | .............. | B65G 1/0464 |
| | | | | 414/626 |
| 2010/0003111 A1 * | 1/2010 | Yeo | .................... | H01L 21/67769 |
| | | | | 414/222.07 |
| 2010/0290873 A1 * | 11/2010 | Bonora | ............. | H01L 21/67769 |
| | | | | 414/225.01 |
| 2014/0068753 A1 * | 3/2014 | Gonzalez | ........... | G05B 19/4189 |
| | | | | 726/17 |
| 2017/0194182 A1 * | 7/2017 | Takai | ................ | H01L 21/67733 |

(Continued)

FOREIGN PATENT DOCUMENTS

| | | |
|---|---|---|
| JP | 2004-307125 | 11/2004 |
| JP | 2008-263004 | 10/2008 |

(Continued)

OTHER PUBLICATIONS

Office Action for Korean Application No. 10-2022-0169473 dated Jul. 31, 2024.

*Primary Examiner* — Glenn F Myers

(74) *Attorney, Agent, or Firm* — Harness, Dickey & Pierce, P.L.C.

(57) ABSTRACT

The inventive concept provides a ceiling stocker. The ceiling stocker includes a shelf assembly, at which shelves on which an article is placed are positioned along a first direction on a same plane, is placed in multiple layers; and a transfer module provided at a top part of the shelf assembly and which loads and unloads the article on the shelf, and wherein the transfer module includes: a vehicle moving along a driving rail installed on a ceiling; and a hoist provided at the vehicle, and wherein the shelf assembly includes a shelf driving unit configured to move the shelves along the first direction so a moving path for the hoist to approach the shelf may be provided.

16 Claims, 13 Drawing Sheets

(56)          References Cited

U.S. PATENT DOCUMENTS

2019/0217873 A1 *    7/2019  Imahori  .................... B61B 3/00
2022/0144542 A1 *    5/2022  Baek ........................ B65G 1/06

FOREIGN PATENT DOCUMENTS

JP          2009-51600  A     3/2009
KR           101609338  B1    4/2016
KR          10-1854045        5/2018

* cited by examiner

CEILING STOCKER

CROSS-REFERENCE TO RELATED APPLICATIONS

A claim for priority under 35 U.S.C. § 119 is made to Korean Patent Application No. 10-2022-0169473 filed on Dec. 7, 2022, in the Korean Intellectual Property Office, the entire contents of which are hereby incorporated by reference.

BACKGROUND

Embodiments of the inventive concept described herein relate to a stocker, more specifically, a ceiling stocker capable of loading multiple layers.

In general, a semiconductor element manufacturing process is performed by repeatedly performing various unit processes such as an exposing process, an etching process, a diffusion process, a deposition process, and a metal process on a substrate or a wafer (hereinafter, unified as 'substrate'). In each unit process, the substrate is moved using a carrier on which a plurality of substrates may be loaded or is put into each process in a carrier state.

The carriers may be stored in a stocker. The stocker may include a plurality of shelves for storing the carriers, and a robot for transferring the carriers may be disposed within the stocker. A transfer robot may be moved in a horizontal direction and a vertical direction, and may transfer the carrier.

In general, the shelf of a stocker has multiple layers in the vertical direction by a moving path of the transfer robot which transfers the carrier, but is composed of one row in the horizontal direction. Therefore, there is a limit to a carrier capacity which can be loaded on one stocker, and since it is installed at a bottom of a manufacturing line, it is difficult to secure an installation space.

Although a ceiling stocker has been proposed to solve this problem, the ceiling stocker has a limitation in a loading amount due to a single-layer loading shelf structure, and only a horizontal expansion is possible to increase the loading amount.

SUMMARY

Embodiments of the inventive concept provide a ceiling stocker which can be vertically expanded.

Embodiments of the inventive concept provide a ceiling stocker for increasing a transfer load amount and for increasing a loading efficiency.

The technical objectives of the inventive concept are not limited to the above-mentioned ones, and the other unmentioned technical objects will become apparent to those skilled in the art from the following description.

The inventive concept provides a ceiling stocker. The ceiling stocker includes a shelf assembly, at which shelves on which an article is placed are positioned along a first direction on a same plane, is placed in multiple layers; and a transfer module provided at a top part of the shelf assembly and which loads and unloads the article on the shelf, and wherein the transfer module includes: a vehicle moving along a driving rail installed on a ceiling; and a hoist provided at the vehicle, and wherein the shelf assembly includes a shelf driving unit configured to move the shelves along the first direction so a moving path for the hoist to approach the shelf may be provided.

In an embodiment, the shelf assembly further includes a shelf rail for moving the shelves, and wherein the shelf driving unit includes: a moving body moving along the shelf rail; and a clamp installed on the moving body and for clamping at least one of the shelves.

In an embodiment, the shelf rail is provided along the first direction and which supports each end of the shelves.

In an embodiment, the clamp includes any one type of a vacuum clamp, a magnetic clamp, and a mechanical clamp.

In an embodiment, the moving body is moved by any one of a linear motor, a belt method or a bolt-screw method.

In an embodiment, the moving path is provided at a shelf assembly except for a shelf assembly positioned at a bottommost layer among the shelf assemblies.

In an embodiment, a shelf of a shelf assembly positioned at a bottommost layer among the shelf assemblies is a fixed shelf.

In an embodiment, the shelf includes stages at which the article is seated, and the stage is positioned along a second direction which crosses the first direction.

In an embodiment, the driving rail includes: a first driving rail positioned spaced apart along the first direction; a girder moving along the first driving rail while having both ends supported by the first driving rail and having a second driving rail, and wherein the vehicle is installed to be movable along the second driving rail.

The inventive concept provides a ceiling stocker. The ceiling stocker includes a first shelf layer having bottom shelves on which an article is placed positioned along a first direction on a same plane; a second shelf layer having top shelves on which an article is placed positioned along the first direction on a same plane and which is positioned at a top part of the first shelf layer; and a transfer module provided at a top part of the second shelf layer and loading and unloading the article on the bottom shelf and the top shelf, and wherein at the second shelf layer, the top shelves are movable along the first direction so a moving path is provided so the transfer module may approach the bottom shelf.

In an embodiment, the ceiling stocker further includes at least one intermediate shelf layer provided between the first shelf layer and the second shelf layer, and wherein the intermediate shelf layer includes: intermediate shelves positioned along the first direction on a same plane and having an article placed thereon; and a shelf driving unit moving the intermediate layer shelves along the first direction so a moving path is provided so the transfer module may approach the bottom shelf.

In an embodiment, the second shelf layer includes: a shelf rail for moving the top shelves; and a shelf driving unit for moving the top layer shelves along the shelf rail, and wherein the shelf driving unit includes: a moving body which is movable along the shelf rail; and a clamp installed on the moving body and for clamping at least one of the top shelf layers.

In an embodiment, the shelf rail is provided along the first direction and which supports each end of the top shelves.

In an embodiment, the clamp includes any one type of a vacuum clamp, a magnetic clamp, and a mechanical clamp, and the moving body is moved by any one of a linear motor, a belt method or a bolt-screw method.

In an embodiment, the bottom shelves are a fixed-type.

In an embodiment, the bottom shelf and the top shelf includes stages at which the article is seated, and the stage is positioned along a second direction which crosses the first direction.

In an embodiment, the transfer module includes: a first driving rail positioned spaced apart along the first direction; a girder moving along the first driving rail while having both ends supported by the first driving rail and having a second driving rail, a vehicle movable along the second driving rail; and a hoist provided at the vehicle.

In an embodiment, the transfer module includes a first driving unit configured to provide a power, and a power of the shelf driving unit is provided from the first driving unit.

The inventive concept provides a ceiling stocker. The ceiling stocker includes a first shelf layer having bottom shelves on which an article is placed positioned along a first direction on a same plane; a second shelf layer having top shelves on which an article is placed positioned along the first direction on a same plane and which is positioned at a top part of the first shelf layer in multiple layers; and a transfer module provided at a top part of the second shelf layer and loading and unloading the article on the bottom shelf and the top shelf, and wherein the transfer module includes: a vehicle moving along a driving rail installed on a ceiling; and a hoist provided at the vehicle, and wherein the second shelf layer includes: a shelf rail for moving the top shelves; and a shelf driving unit for moving the top shelves along the shelf rail so a moving path is provided for the hoist to approach the bottom shelf.

In an embodiment, the shelf driving unit includes: a moving body moving along the shelf rail; and a clamp installed on the moving body and for clamping at least one of the top shelves, and wherein the shelf rail is provided along the first direction and which supports each end of the shelves, and the clamp includes any one type of a vacuum clamp, a magnetic clamp, and a mechanical clamp, and the moving body is moved by any one of a linear motor, a belt method or a bolt-screw method.

According to an embodiment of the inventive concept, a transfer load amount is increased, by a vertical expansion of shelves being possible.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 1 is a view for describing a ceiling stocker according to an embodiment of the inventive concept.

FIG. 4 illustrates a transfer module.

Figure 5B:
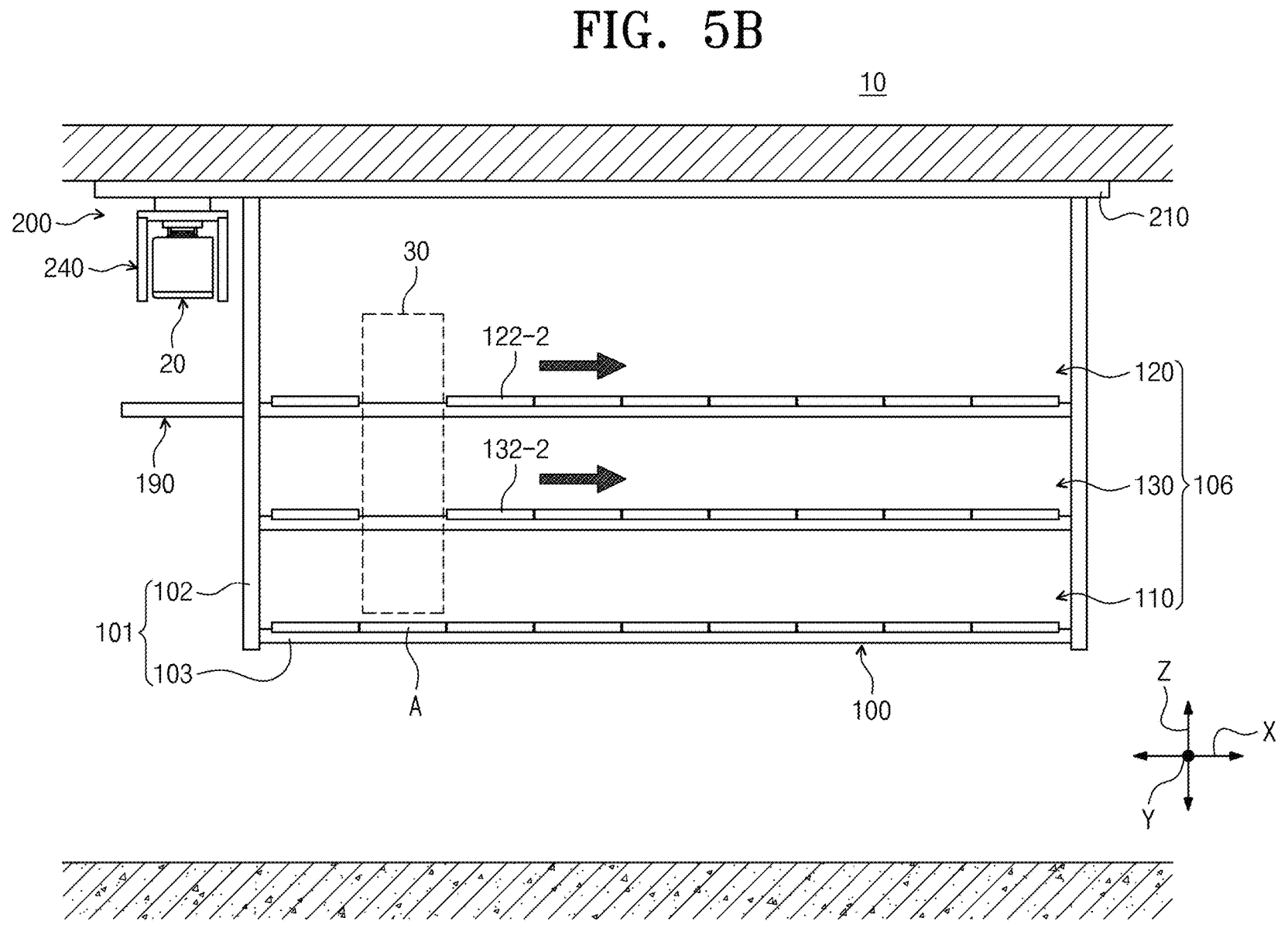
Figure 5C:
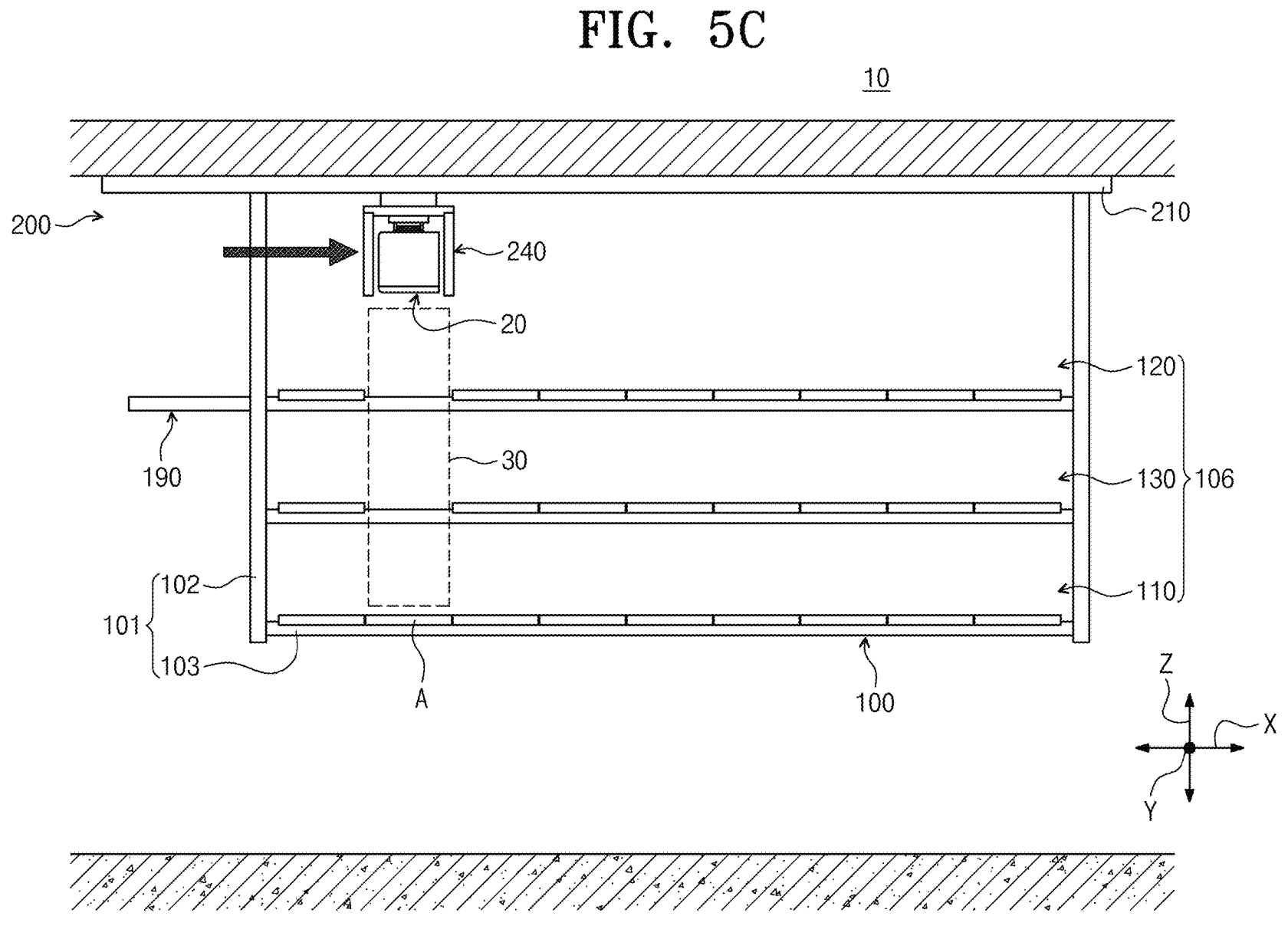
Figure 5D:
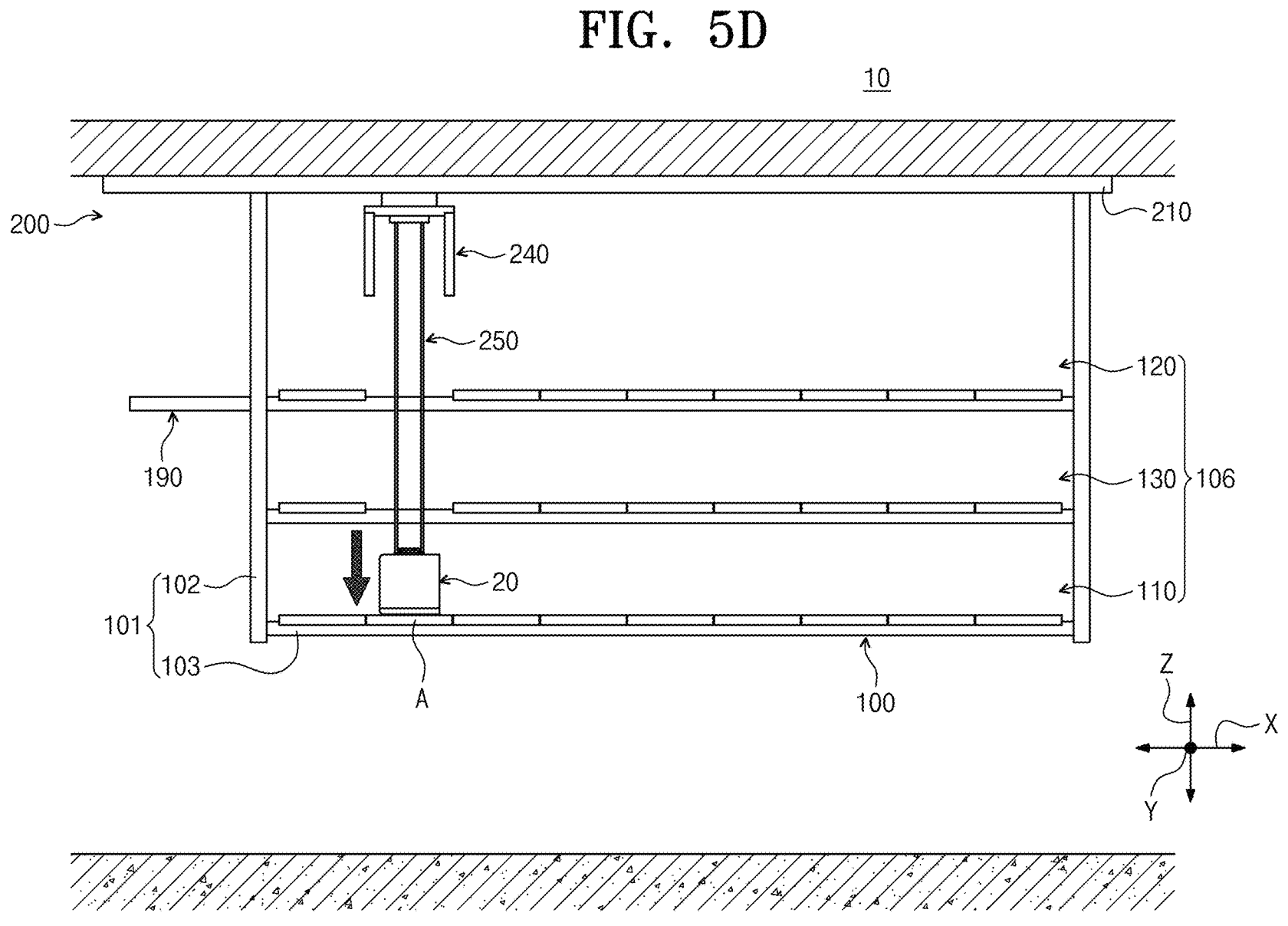
Figure 5E:
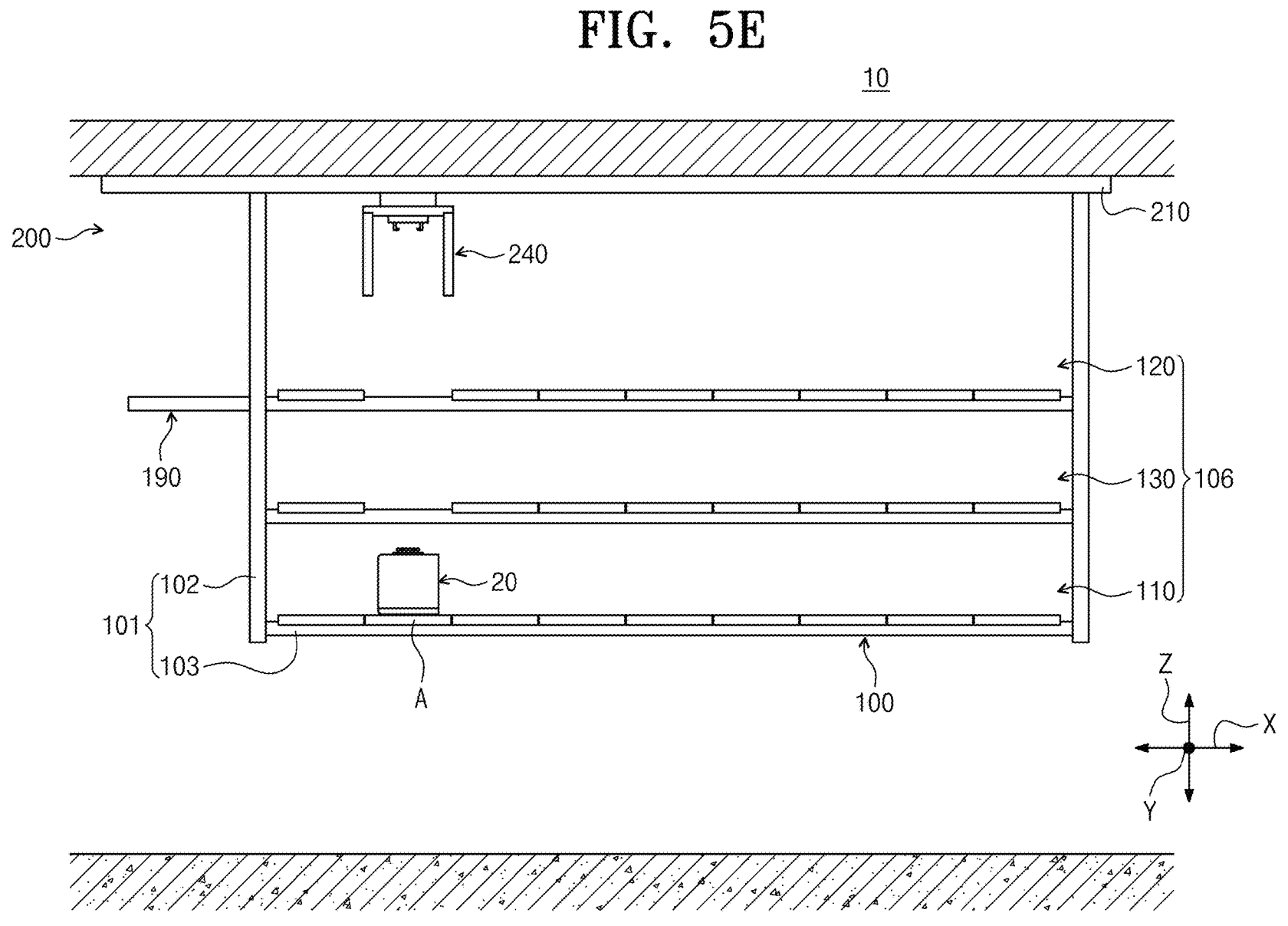

FIG. 5A to FIG. 5E illustrate a transfer and loading operation of an article in a ceiling stocker.

DETAILED DESCRIPTION

Figure 2A:
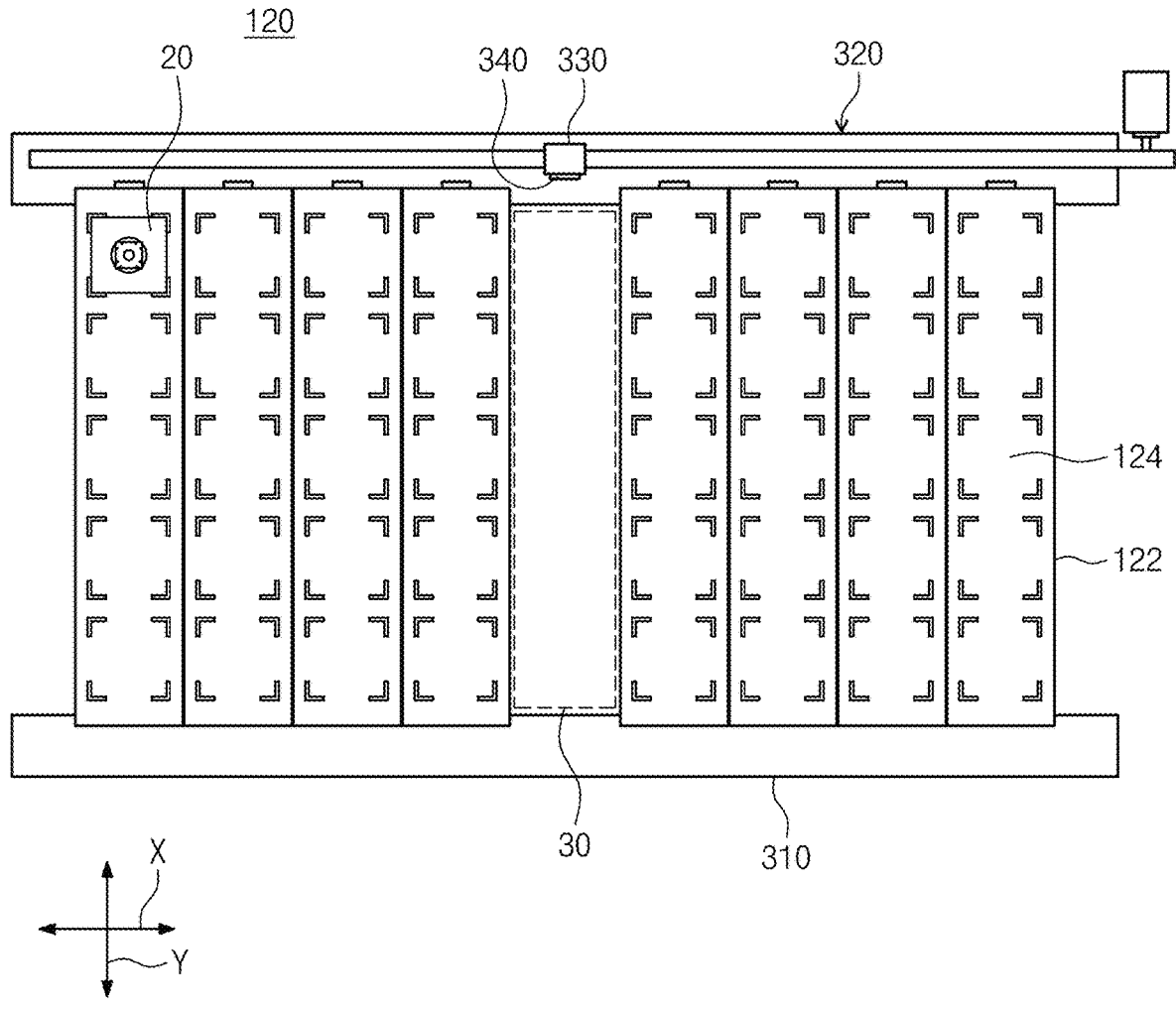
FIG. 2A is a view of a second shelf layer viewed from a plane.

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., ±10%).

When the terms "about" or "substantially" are used in connection with a numerical value, it should be understood that the associated numerical value includes a manufacturing or operational tolerance (e.g., ±10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 1:
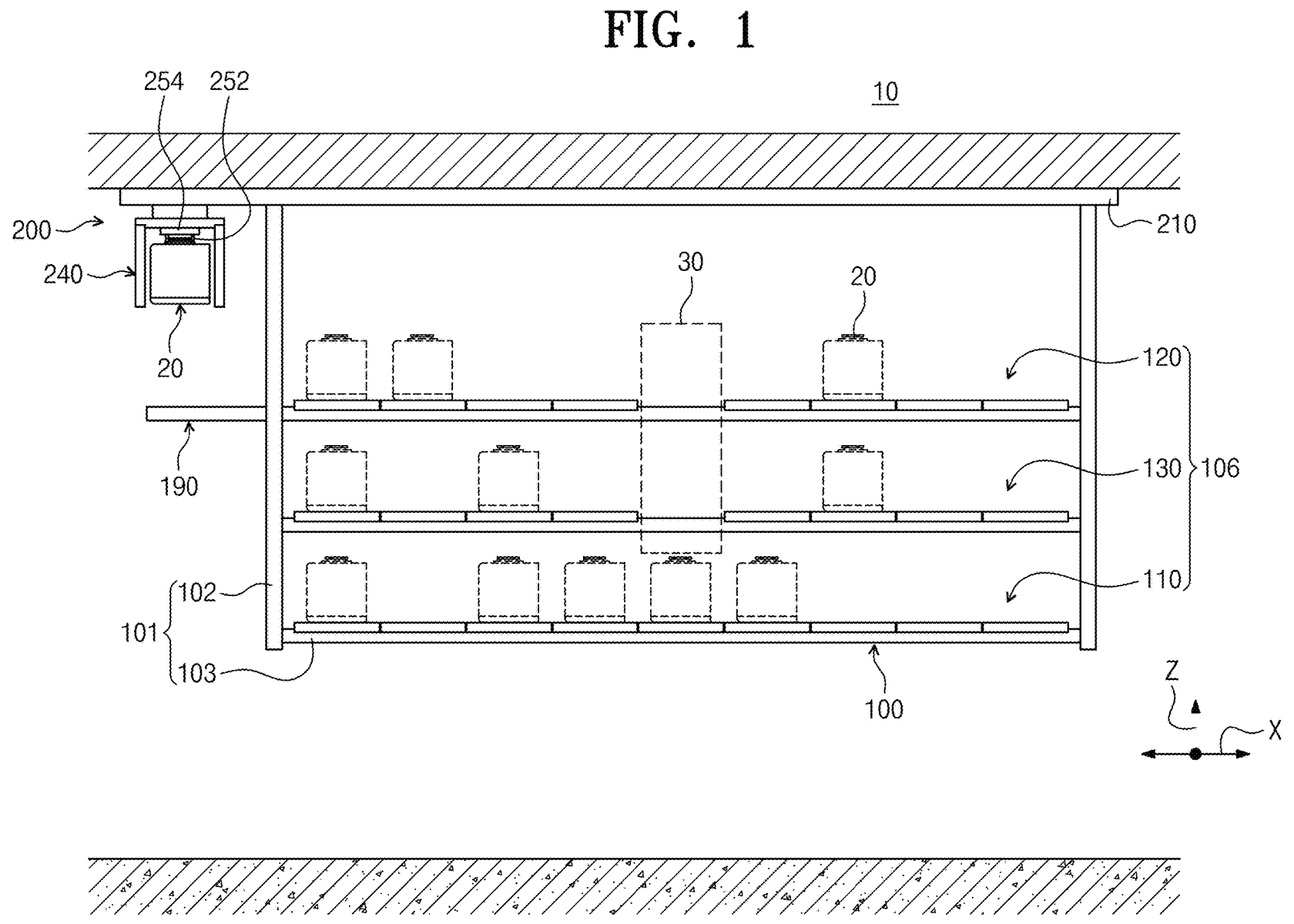

FIG. 1 is a view for describing a ceiling stocker according to an embodiment of the inventive concept.

Referring to FIG. 1, the ceiling stocker 10 may include a shelf unit 100 and a transfer module 200.

The shelf unit 100 may include a frame 101 and a shelf assembly 106. The frame 101 has a top portion completely opened and may include a side frame 102 and a bottom frame 103. An entry/exit shelf may be provided outside the frame 101. An article 20 may be loaded on the entry/exit shelf 190. The article may be transferred by an outer transfer robot (not shown) and placed on the entry/exit shelf 190. The article 20 placed on the entry/exit shelf 190 may be transferred by a transfer module 200 and transferred to any one of the shelves of the shelf assembly 106. Here, the outer transfer robot may be an overhead hoist transport (OHT).

The shelf assembly 106 may be installed in multiple stages on the frame 101. In an embodiment, the shelf assembly 106 may include a first shelf layer 110, a second shelf layer 120, and a third shelf layer 130. In the embodiment, although the shelf assembly 106 is illustrated to have three shelf layers, the inventive concept is not limited thereto, and may be provided in a two shelf layer structure or a three or more shelf layer structure.

The first shelf layer 110 may be disposed on a bottom layer of the frame 101, the second shelf layer 120 may be disposed on a top layer of the frame 101, and the third shelf layer 130 may be disposed between the first shelf layer 110 and the second shelf layer 120.

The first shelf layer 110 may include bottom shelves 112, and the bottom shelves 112 may be disposed along a first direction (X-axis). The stages 114 on which the article 20 is placed may be provided in the bottom shelf 112 along a second direction (Y-axis). The bottom shelves 112 may be provided in a fixed form to the frame 101.

Here, the article 20 is an object to be transferred, and may be, for example, a single article, or a combination of a plurality of items such as an article to be stored and a container for storing the article to be stored. In the embodiment, the object to be transferred 20 may be a substrate storage container such as a front opening unified pod (FOUP) in which a plurality of substrates are stored.

The second shelf layer 120 may include top shelves 122, and the top shelves 122 may be disposed along the first direction X. The stages 124 on which the article 20 is placed may be provided along the second direction Y on the top shelves 122. The bottom shelves 122 may be provided to be movable along the first direction X.

The third shelf layer 130 may be provided in the same configuration as the second shelf layer 120. In an embodiment, the third shelf layer 130 has intermediate layer shelves 132 disposed along the first direction X. The stages 134 on which the article 20 is placed may be provided along the second direction Y on the intermediate layer shelves 132. The intermediate layer shelves 132 may be provided to be movable along the first direction X in the same manner as the top layer shelves 122.

Figure 2B:
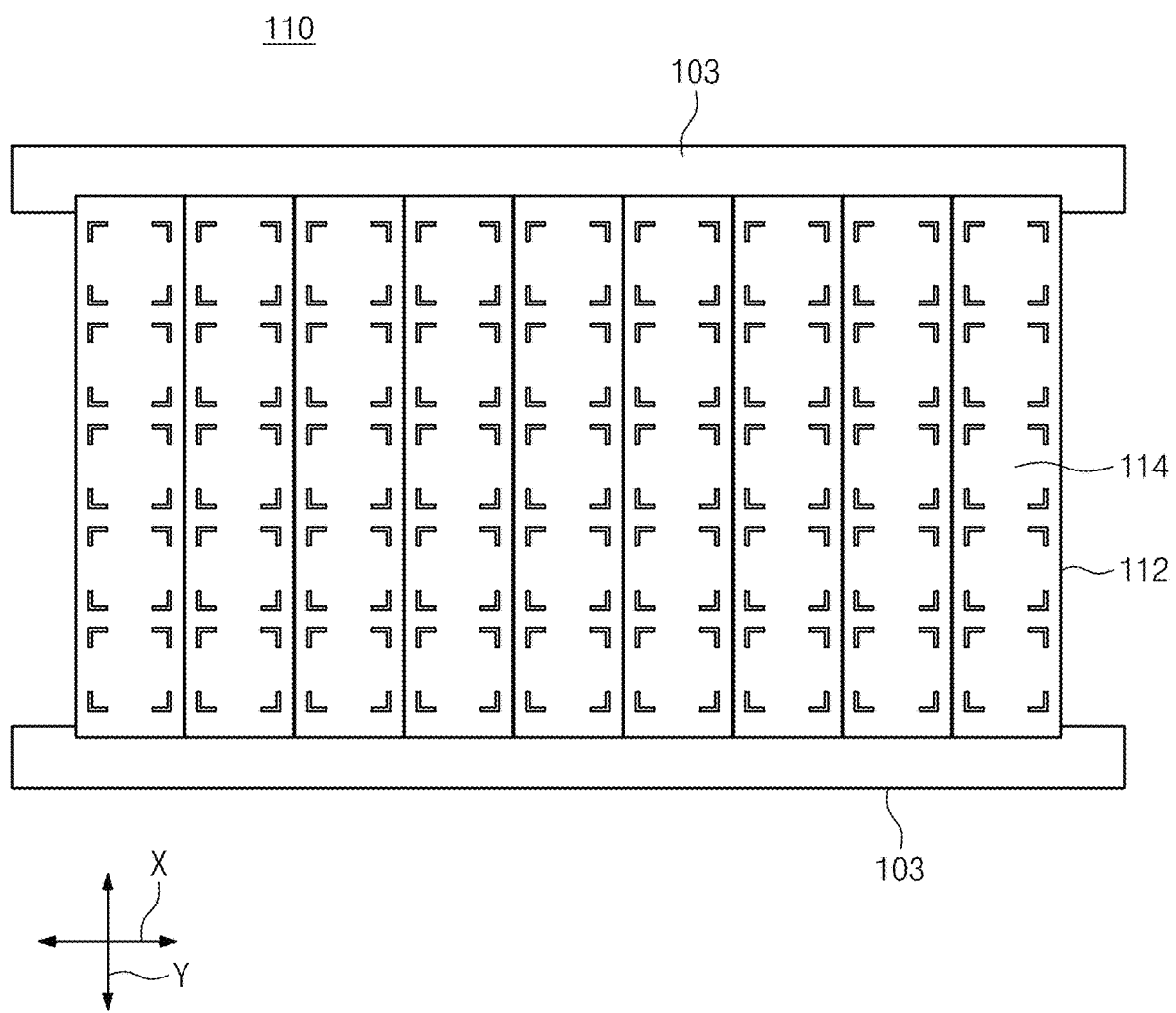
FIG. 2B is a view of a first shelf layer viewed from a plane.
Figure 3:
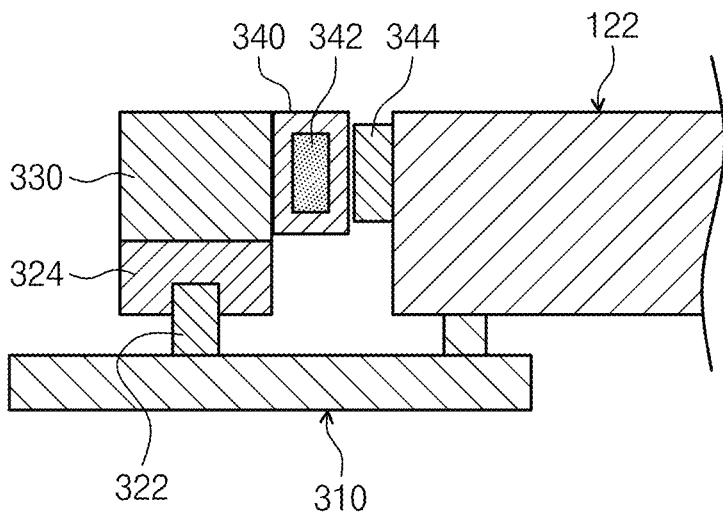
FIG. 3 illustrates a shelf driving unit.
Figure 5A:
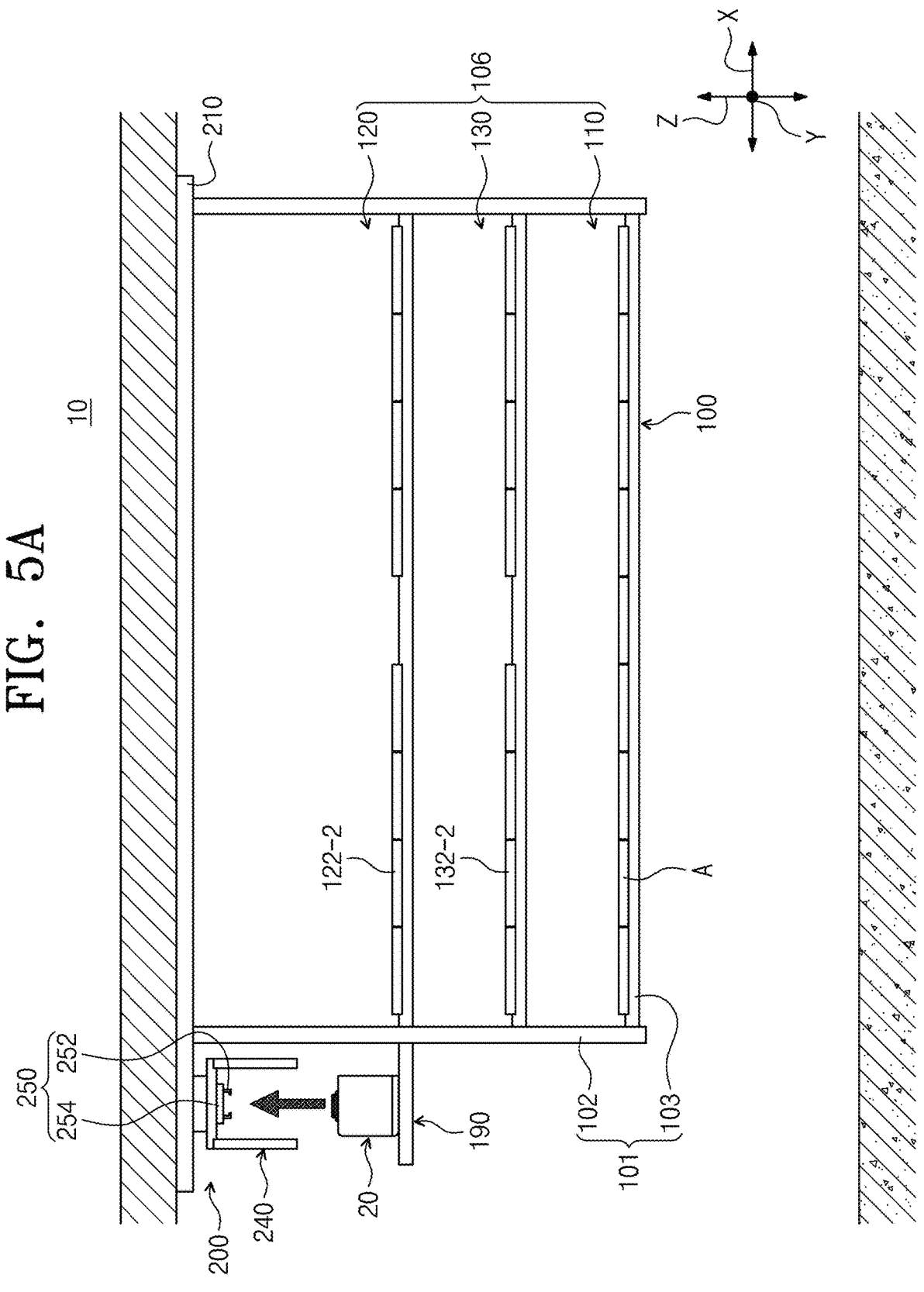

FIG. 2A is a view of the second shelf layer viewed from a plane, and FIG. 2B is a view of the first shelf layer viewed from a plane. FIG. 3 illustrates a shelf driving unit. For reference, the third shelf layer has the same arrangement structure as the second shelf layer.

As shown in FIG. 2A to FIG. 3, the top shelves 122 of the second shelf layer 120 (the third shelf layer) may be disposed less than the number of bottom shelves 112 disposed on the first shelf layer 110. Accordingly, the second shelf layer 120 (the third shelf layer) may be provided with a moving path 30 through which the article 20 may move. The moving path 30 is a variable path through which a position thereof may be changed according to a movement of the top shelves 122. In an embodiment, nine bottom shelves 112 are disposed in close contact with the first shelf layer 110, and eight top shelves 122 are disposed in the second shelf layer 120 (third shelf layer). In FIG. 2A, the moving path 30 of the second shelf layer 120 is provided at a position corresponding to a top portion of a fifth bottom shelf 112 of the first shelf layer 110. However, the moving path 30 may be varied to correspond to any one of a first to a ninth bottom shelves of the first shelf 110 according to the movement of the top shelves 122.

Each of the second shelf layer 120 and the third shelf layer 130 may include a shelf rail 310 and a shelf driving unit 320. Since the shelf rail 310 and the shelf driving unit 320 are provided with the same configuration in each of the second shelf layer 120 and the third shelf layer 130, only the shelf rail 310 and the shelf driving unit 320 installed in the second shelf layer will be described below.

The shelf rail 310 is provided for moving the top shelves 122. The shelf rail 310 is provided along the first direction X and is provided to support both ends of the top shelves 122. The shelf rail 310 is supported by the frame 101.

The shelf driving unit 320 moves the top shelves 122 along the first direction X so that a moving path 30 through which a hoist can access the shelves 112 and 132 is provided. The shelf driving unit 320 may include a moving body 330 movable along the shelf rail 310 and a clamp 340 installed on the moving body 330.

The moving body 330 may be moved by a linear motor having a stator 322 and a mover 324. In an embodiment, a stator 322 of the linear motor may be installed on the shelf rail 310, and a mover 324 of the linear motor may be installed on the moving body 330. Here, the mover 324 may be integrally provided with a moving body 330. Although not shown, the moving body 330 may be moved by a variety of straight driving apparatuses, such as a belt type or ball screw type (a conventional apparatus including a ball screw which rotates via a coupler at a rotation rod which rotates by a servomotor, and a ball screw nut which converts a rotational motion of the ball screw into a straight transfer motion).

The clamp 340 may be installed on the moving body 330. The clamp 340 may clamp at least one of the top shelves 122. The clamp 340 is a one-touch fastening mechanism coupled to the top shelf 122 by a magnetic force, a mechanical force, or a physical force. The clamp 340 may include any one of a vacuum clamp, a magnetic clamp, and a mechanical clamp. In an embodiment, the clamp 340 includes an electromagnet 342, and the electromagnet 342 is provided on a surface facing a side of the top shelf 122. A permanent magnet 344 is provided on a side surface of the top shelf 122. The electromagnet 342 and the permanent magnet 344 are provided to have different polarities. If a current is applied to the electromagnet 342 while the moving body 330 is positioned on the top shelf 122 to move, a magnetic force (attraction) of an opposite polarity acts between the electromagnet 342 and the permanent magnet 344, and the clamp 340 firmly clamps the top shelf 122.

Figure 4:
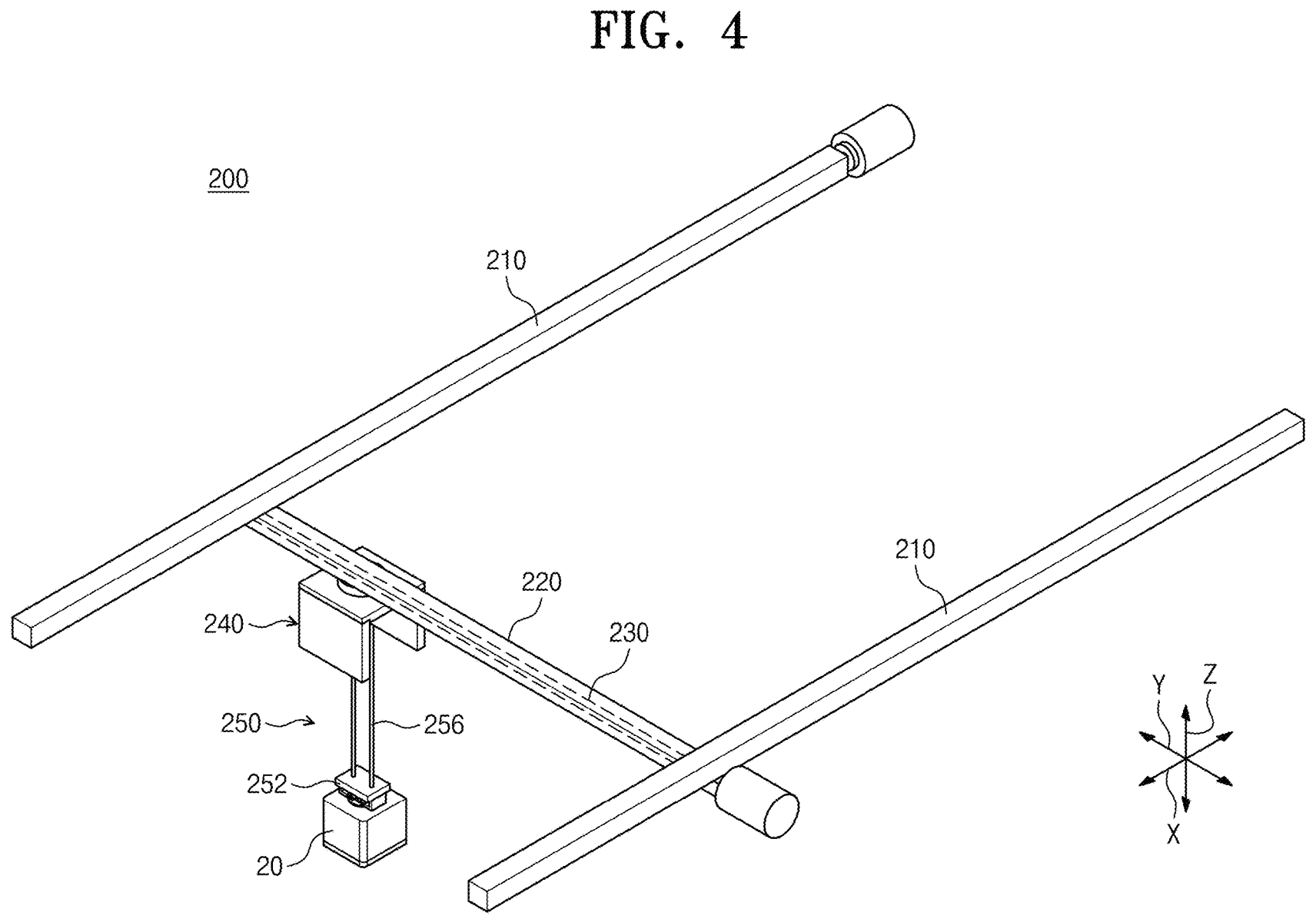

FIG. 4 illustrates the transfer module.

Referring to FIG. 4, the transfer module 200 may include driving rails 210, 220, 230, a vehicle 240, and a hoist 250.

The driving rail may include a first driving rail 210 and a girder 220. The first driving rail 210 may be disposed to be spaced apart from each other in the first direction X. The girder 220 may move along the first driving rail 210 while both ends thereof are supported by the first driving rail 210. The girder 220 may be provided with a second driving rail 230. The vehicle 240 may be installed to be movable along the second driving rail 230. The vehicle 240 is a driving module which travels along the second driving rail 230 by a separate driving unit.

In an embodiment, the vehicle 240 may have a conventional configuration including a power receiving unit which receives a power supplied from a power supply line provided along the second driving rail 230 in a non-contact method due to a magnetic induction, a driving unit which drives the vehicle 240, and a storage apparatus which stores the power supplied from the power receiving unit, and a detailed description thereof will be omitted.

The hoist 250 is an apparatus for loading and unloading the article 20 onto a shelf. The hoist 250 may include a gripper 252 for picking up the article 20 and a lifting/lowering unit 254 for lifting/lowering the gripper 252.

The gripper 252 grips or un-grips the article 20. The gripper 252 may be connected to a lifting/lowering belt 256 of the lifting/lowering unit 254. In addition, the article 20 may be provided with a flange configured to be gripped by the gripper 252.

The gripper 252 may be driven by a driving unit (not shown). For example, the driving unit of the gripper 252 may operate the gripper 252 using a cam plate and a cam follower, and may include a motor and a ball screw for moving the cam plate. However, since the configuration of the gripper 252 itself may be variously changed, the scope of the inventive concept will not be limited thereto.

The lifting/lowering unit 254 moves the gripper 252 in the vertical direction. The lifting/lowering unit 254 may include a driver and a lifting/lowering belt 256. The lifting/lowering belt 256 of the lifting/lowering unit 254 may be connected to the gripper 252. The lifting/lowering belt 256 may move the gripper 252 in the vertical direction by a driving force generated by the driver. For example, the driver may wind or loosen the lifting/lowering belt 256 by generating a driving force to move the gripper 252 in the vertical direction. However, the inventive concept is not limited thereto, and the lifting/lowering unit 254 may be transformed into various known devices capable of lifting and lowering the gripper 252.

FIG. 5A to FIG. 5E illustrate a transfer and loading operation of the article in the ceiling stocker.

FIG. 5A to FIG. 5E illustrate a case at which the article 20 is to be transferred to the bottom shelf 112 (hereinafter referred to as A) positioned second from the left side of the first shelf layer 110 as an example.

First, the article 20 transferred by an outer transfer robot is placed on the entry/exit shelf 190. The transfer module 200 lifts the article 20 placed on the entry/exit shelf 190. The second shelf layer 120 and the third shelf layer 130 create a moving path 30 accessible by the hoist 250 by a bottom shelf A positioned at the second of the first shelf layer 110.

Figure 6A:
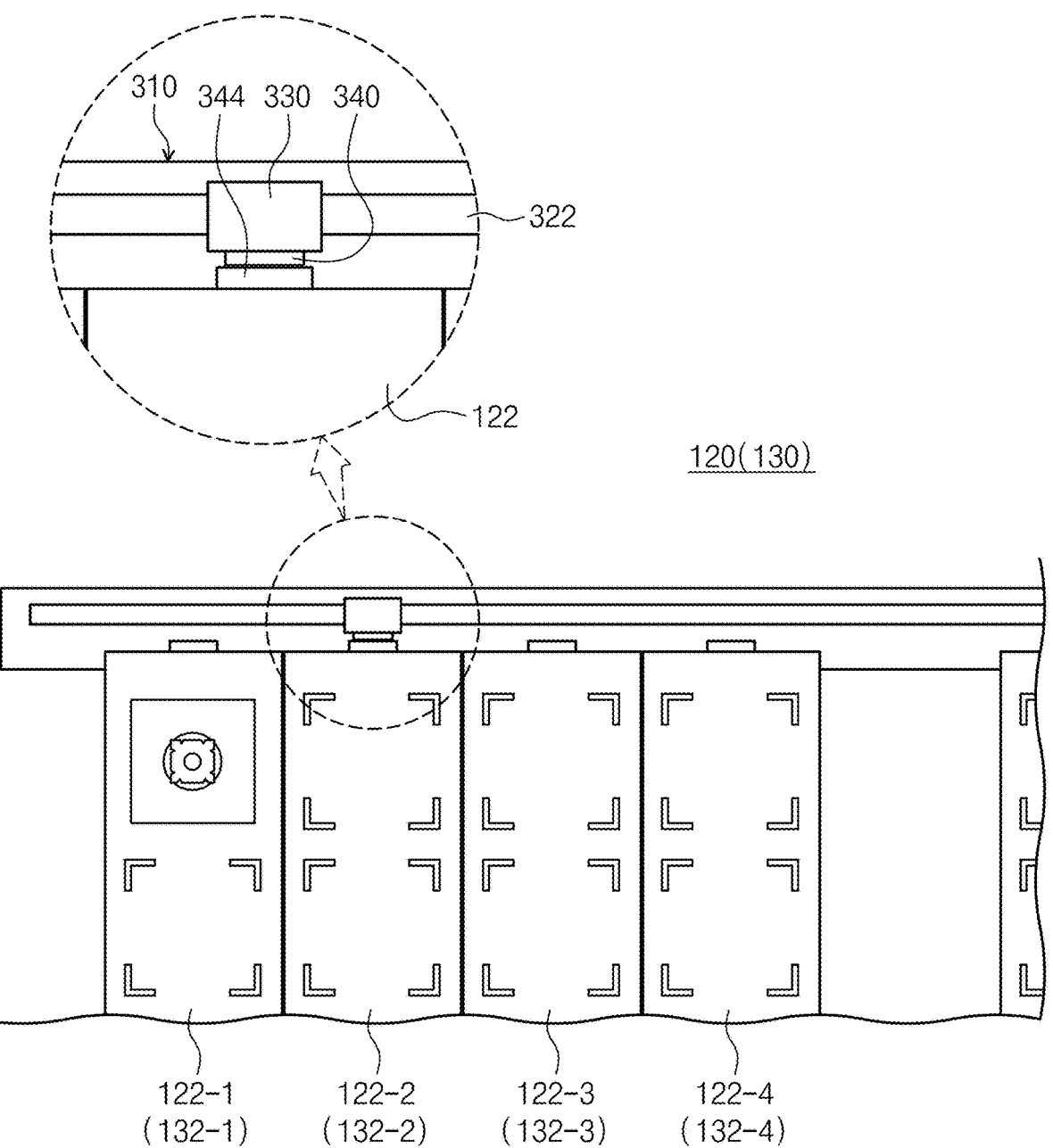
FIG. 6A and FIG. 6B illustrate a process of making a moving path in the second shelf layer.
Figure 6B:
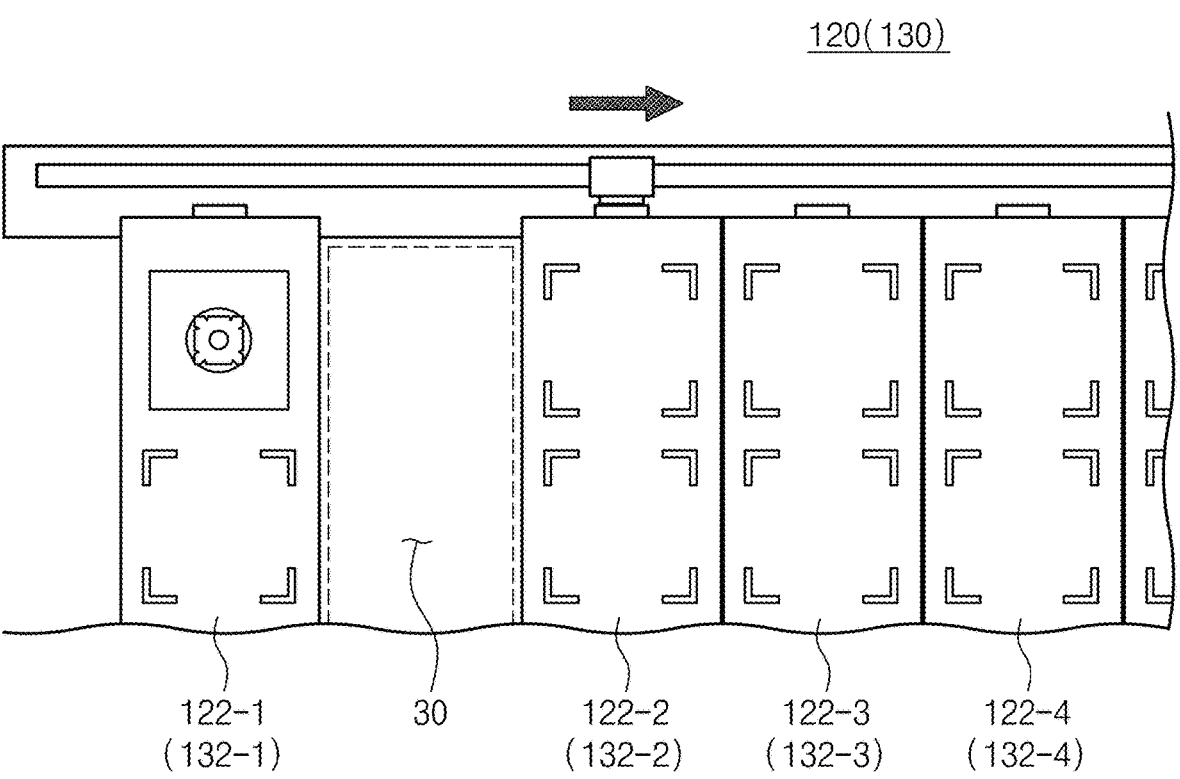

As shown in FIG. 6A and FIG. 6B, in a process of making the moving path 30 in the second shelf layer 120, the moving body 330 moves to the top shelf 122-2 on an expected moving path. And if the clamp 340 clamps the top shelf 122-2, the moving body 330 moves in the right direction (indicated by an arrow). By a movement of the moving body 330, the top shelf 122-2 clamped by the clamp 340 and the two top shelves 122-3 and 122-4 next to it move to the right together, creating a moving path 30 between a first bottom shelf 122-1 and a second bottom shelf 122-2.

A process of creating the moving path in the third shelf layer 130 is the same as the process of creating the moving path in the second shelf layer 120. First, the moving body 330 moves to the intermediate layer shelf 132-2 on an expected moving path. And if the clamp 240 clamps the intermediate layer shelf 132-2, the moving body 330 moves in the right direction. By a movement of the moving body 330, the intermediate layer shelf 132-2 clamped by the clamp 340 and the two intermediate layer shelves 132-3 and 132-4 next to it move to the right together, creating a moving path 30 between a first intermediate layer shelf 132-1 and a second intermediate layer shelf 132-2.

While the moving path 30 is made in the second shelf layer 120 and the third shelf layer 130, the transfer module 200 is moved to a top part of the moving path 30. And, if the moving path 30 is made, the transfer module 200 transfers and loads the article 20 to a bottom shelf A of the first shelf layer 110. An operation of making the moving path 30 and an operation of transferring the article 20 by the transfer module 200 to the top part of the moving path 30 may be performed independently regardless of the order.

Figure 7:
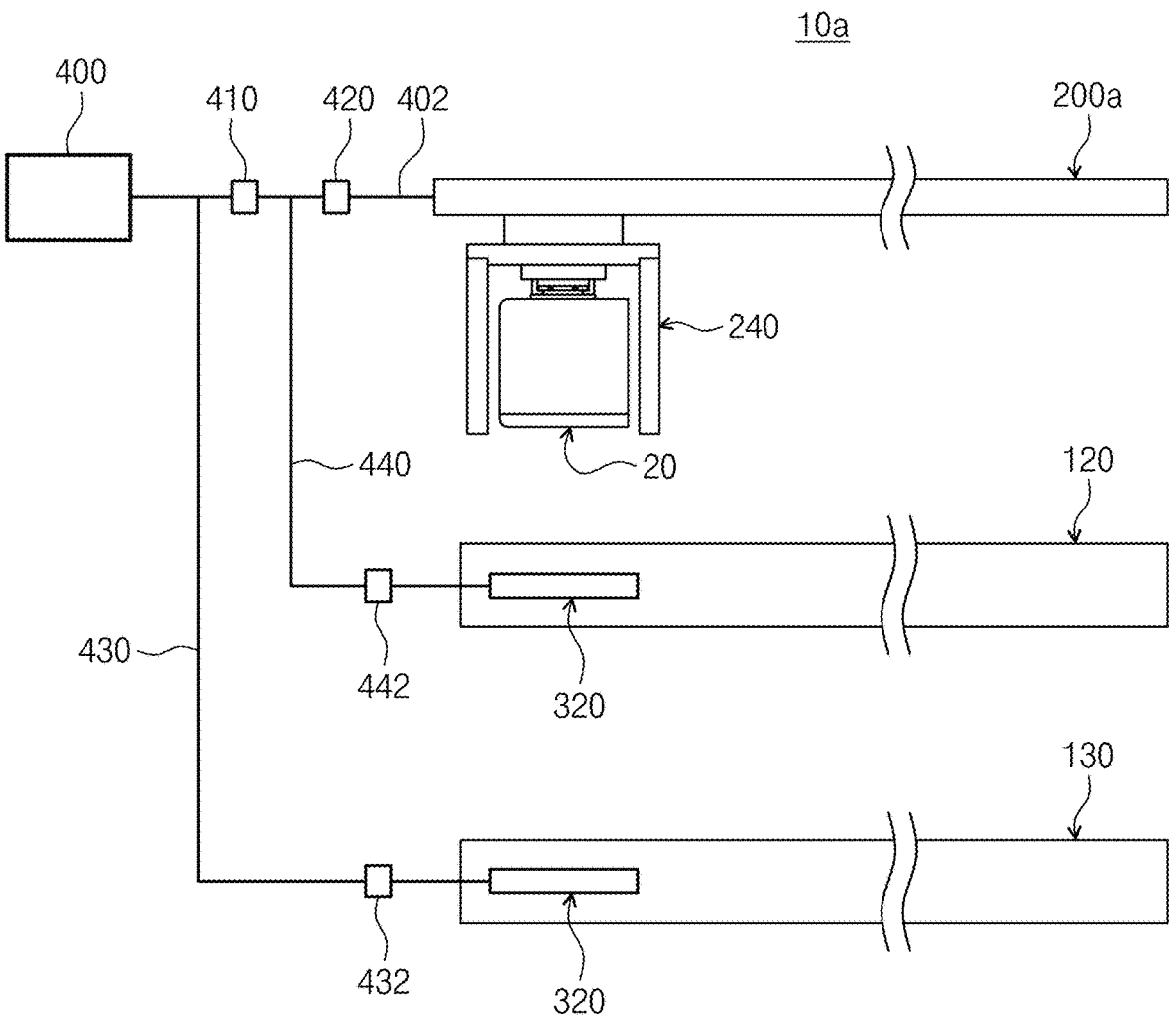
FIG. 7 illustrates another embodiment of the ceiling stocker according to the inventive concept.

FIG. 7 illustrates another embodiment of the ceiling stocker according to the inventive concept.

As shown in FIG. 7, since the ceiling stocker 10a includes a shelf unit 100a and a transfer module 200a, they are provided with a configuration and function generally similar to that of the shelf unit 100 and the transfer module 200 shown in FIG. 1, differences from the embodiment will be mainly described below.

The vehicle 240 of the transfer module 200 may be moved in the first direction X by a power provided from the main driving unit 400. In addition, the main driving unit 400 may selectively provide the power to the shelf driving unit 320 provided to the second shelf layer 120 and the third shelf layer 130, respectively. To this end, a first clutch 410 and a second clutch 420 may be sequentially provided to a power transmission path 402 connected from the main driving unit 400 to the transfer module 200. The shelf driving unit 320 of the third shelf layer 130 receives the power through a first sub-power transmission line 430. The first sub-power transmission line 430 is connected between the main driving unit 400 and the first clutch 410. A sub-clutch 432 is provided to the first sub-power transmission line 430 to control the power provided to the shelf driving unit 320. The shelf driving unit 320 of the second shelf layer 120 receives the power through a second sub-power transmission line 440. The second sub-power transmission line 440 is connected between the first clutch 410 and the second clutch 420. A sub-clutch 442 is provided to the second sub-power transmission line 440 to control the power provided to the shelf driving unit 320.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A ceiling stocker, comprising:
a shelf assembly, at which shelves on which an article is placed are positioned along a first direction on a same plane, is placed in multiple layers; and
a transfer module provided at a top part of the shelf assembly and which loads and unloads the article on the shelf assembly,
wherein the transfer module includes
a first driving unit configured to provide a power;
a vehicle moving along a driving rail installed on a ceiling; and
a hoist provided at the vehicle,
wherein the shelf assembly includes a shelf driving unit configured to move the shelves along the first direction so a moving path for the hoist to approach the shelf assembly may be provided, a power of the shelf driving unit is provided from the first driving unit,
wherein the driving rail includes
first driving rails positioned spaced apart from each other along a second direction, and
a girder moving along the first driving rail while having both ends supported by the first driving rail and having a second driving rail, and
wherein the vehicle is installed to be movable along the second driving rail,
wherein the shelf assembly further includes a shelf rail for moving the shelves, and
wherein the shelf driving unit includes:
a moving body moving along the shelf rail; and
a clamp installed on the moving body and for clamping at least one of the shelves.

2. The ceiling stocker of claim 1, wherein the shelf rail is provided along the first direction and which supports each end of the shelves.

3. The ceiling stocker of claim 1, wherein the clamp includes any one type of a vacuum clamp, a magnetic clamp, and a mechanical clamp.

4. The ceiling stocker of claim 1, wherein the moving body is moved by any one of a linear motor, a belt method or a bolt-screw method.

5. The ceiling stocker of claim 1, wherein the moving path is provided at a shelf assembly except for a shelf assembly positioned at a bottommost layer among the shelf assemblies.

6. The ceiling stocker of claim 1, wherein a shelf of a shelf assembly positioned at a bottommost layer among the shelf assemblies is a fixed shelf.

7. The ceiling stocker of claim 1, wherein the shelf assembly includes stages at which the article is seated, and the stage is positioned along the second direction which crosses the first direction.

8. A ceiling stocker comprising:
a first shelf layer having bottom shelves on which an article is placed positioned along a first direction on a same plane;
a second shelf layer having top shelves on which an article is placed positioned along the first direction on a same plane and which is positioned at a top part of the first shelf layer, the second shelf layer having a shelf driving unit for moving the top shelves; and
a transfer module provided at a top part of the second shelf layer and loading and unloading the article on the bottom shelf and the top shelf, the transfer module including a first driving unit configured to provide a power, the power configured to power the shelf driving unit, and
wherein at the second shelf layer, the top shelves are movable along the first direction so a moving path is provided so the transfer module may approach the bottom shelf.

9. The ceiling stocker of claim 8, further comprising at least one intermediate shelf layer provided between the first shelf layer and the second shelf layer, and
wherein the intermediate shelf layer includes:
intermediate shelves positioned along the first direction on a same plane and having an article placed thereon; and
a shelf driving unit moving the intermediate layer shelves along the first direction so a moving path is provided so the transfer module may approach the bottom shelf.

10. The ceiling stocker of claim 8, wherein the second shelf layer includes:
a shelf rail for moving the top shelves, wherein the shelf driving unit moves the top shelves along the shelf rail; and
wherein the shelf driving unit includes:
a moving body which is movable along the shelf rail; and
a clamp installed on the moving body and for clamping at least one of the top shelf layers.

11. The ceiling stocker of claim 10, wherein the shelf rail is provided along the first direction and which supports each end of the top shelves.

12. The ceiling stocker of claim 10, wherein the clamp includes any one type of a vacuum clamp, a magnetic clamp, and a mechanical clamp, and the moving body is moved by any one of a linear motor, a belt method or a bolt-screw method.

13. The ceiling stocker of claim 10, wherein the bottom shelves are a fixed-type.

14. The ceiling stocker of claim 8, wherein the bottom shelf and the top shelf includes stages at which the article is seated, and the stage is positioned along a second direction which crosses the first direction.

15. The ceiling stocker of claim 8, wherein the transfer module includes:
first driving rails positioned spaced apart from each other along the first direction;

a girder moving along the first driving rail while having both ends supported by the first driving rails and having a second driving rail, a vehicle movable along the second driving rail; and a hoist provided at the vehicle.

16. A ceiling stocker comprising:

a first shelf layer having bottom shelves on which an article is placed positioned along a first direction on a same plane;

a second shelf layer having top shelves on which an article is placed positioned along the first direction on a same plane and which is positioned at a top part of the first shelf layer in multiple layers; and a transfer module provided at a top part of the second shelf layer and loading and unloading the article on the bottom shelf and the top shelf, wherein the transfer module includes a first driving unit;

a vehicle moving along a driving rail installed on a ceiling; and a hoist provided at the vehicle, wherein the second shelf layer includes a shelf rail for moving the top shelves, and a shelf driving unit for moving the top shelves along the shelf rail so a moving path is provided for the hoist to approach the bottom shelf, a power of the shelf driving unit provided from the first driving unit, wherein the driving rail includes first driving rails positioned spaced apart from each other along a second direction, and a girder moving along the first driving rail while having both ends supported by the first driving rail and having a second driving rail, and wherein the vehicle is installed to be movable along the second driving rail, wherein the shelf driving unit includes:

a moving body moving along the shelf rail; and a clamp installed on the moving body and for clamping at least one of the top shelves, and wherein the shelf rail is provided along the first direction and which supports each end of the shelves, and the clamp includes any one type of a vacuum clamp, a magnetic clamp, and a mechanical clamp, and the moving body is moved by any one of a linear motor, a belt method or a bolt-screw method.

* * * * *